United States Patent
Kolodziej et al.

(10) Patent No.: US 6,791,406 B2
(45) Date of Patent: Sep. 14, 2004

(54) POWER SERVO-LOOP, AN RF SIGNAL AMPLIFIER CIRCUIT, AND AN RF SIGNAL TRANSMITTER FITTED WITH SUCH A CIRCUIT

(75) Inventors: Pierre Kolodziej, Bagneaux/Loing (FR); Mikaël Pouliquen, Paris (FR)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 10/367,934

(22) Filed: Feb. 19, 2003

(65) Prior Publication Data

US 2003/0155971 A1 Aug. 21, 2003

(30) Foreign Application Priority Data

Feb. 19, 2002 (FR) ............................................ 02 02090

(51) Int. Cl.⁷ ................................................ H03G 3/20
(52) U.S. Cl. ........................ 330/129; 330/132; 330/140
(58) Field of Search ................................ 330/129, 132, 330/140, 141, 279, 281; 455/126

(56) References Cited

U.S. PATENT DOCUMENTS

| 4,122,400 A | 10/1978 | Medendorp et al. |
| 4,353,037 A | 10/1982 | Miller |
| 4,729,129 A | 3/1988 | Koerner |
| 6,549,068 B1 * | 4/2003 | Bollenbeck ............. 330/141 X |

* cited by examiner

Primary Examiner—Steven J. Mottola
(74) Attorney, Agent, or Firm—Sughrue Mion, PLLC

(57) ABSTRACT

The present invention relates to a power servo-loop in particular for controlling a power amplifier, the loop comprising a detection circuit (100) having coupling means (1) for taking off RF signals, and a detection unit (400) for delivering a detection signal (Vdet) partially representative of a first RF signal taken off by the coupling means. The detection circuit of the invention comprises, between the coupling means and the detection unit, detection control means (21, 22, 4) for substantially eliminating an "interfering" second RF signal also taken off by the coupling means, such that the detection signal is entirely representative of the first RF signal.

16 Claims, 2 Drawing Sheets

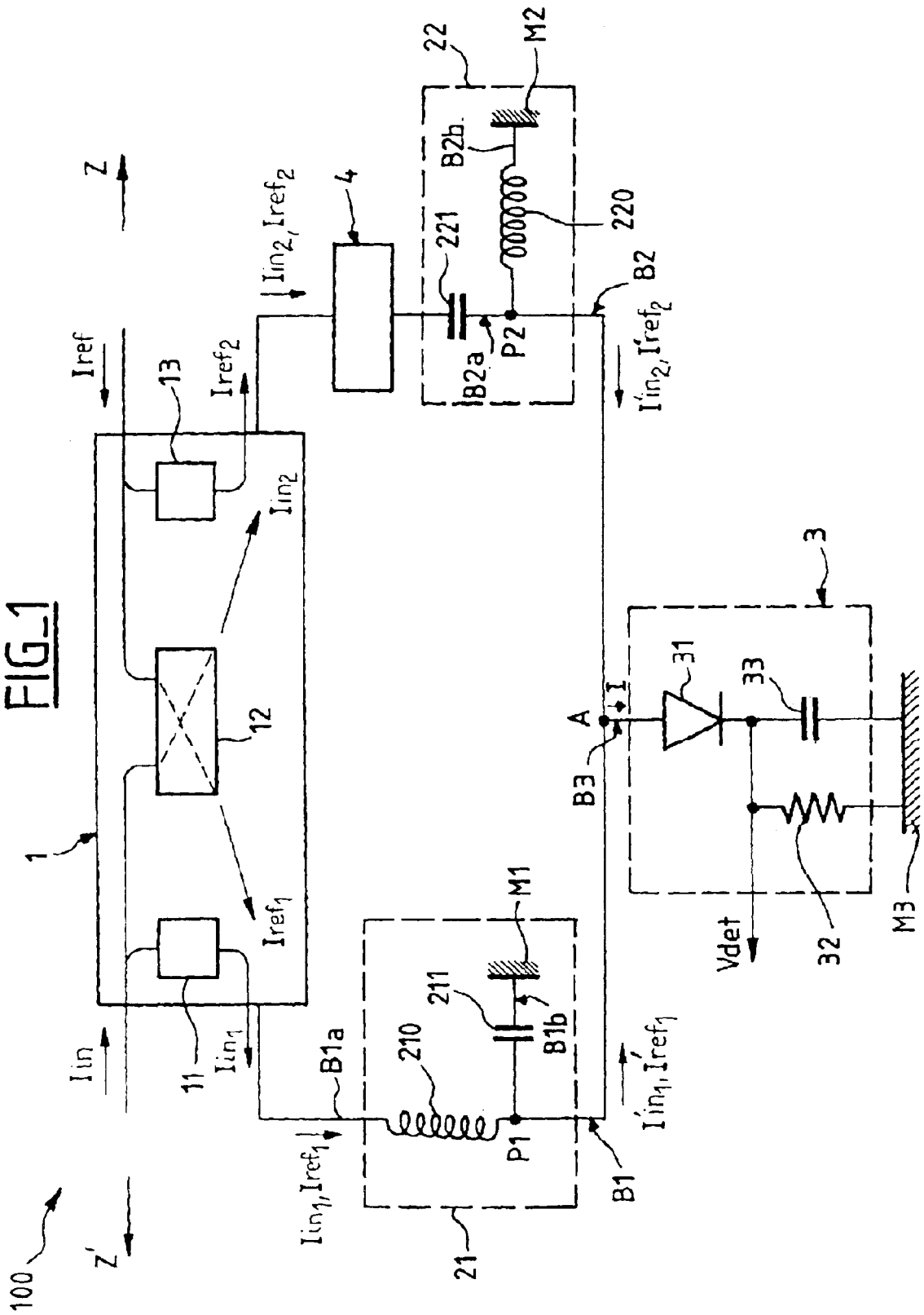

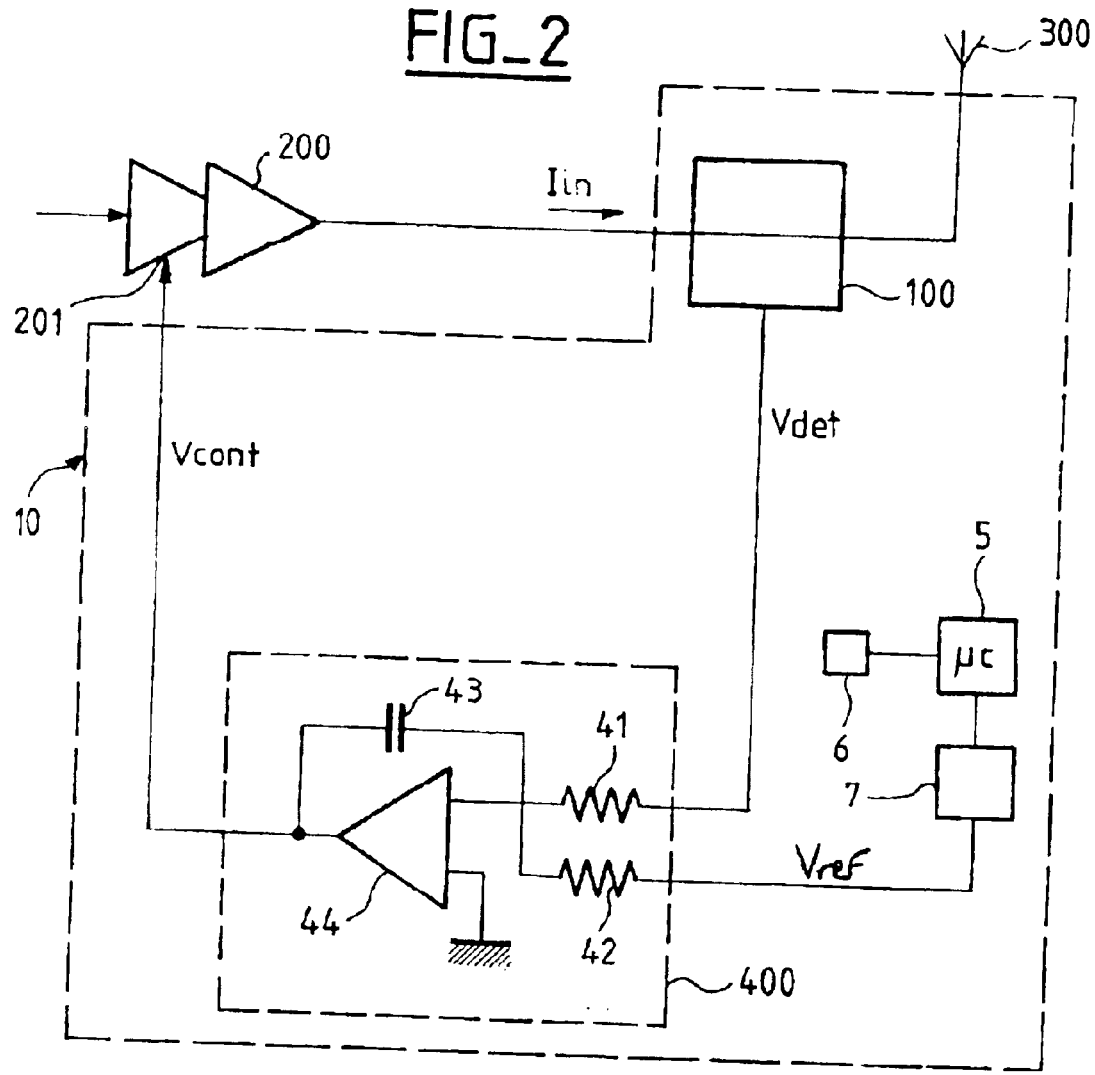
FIG_2
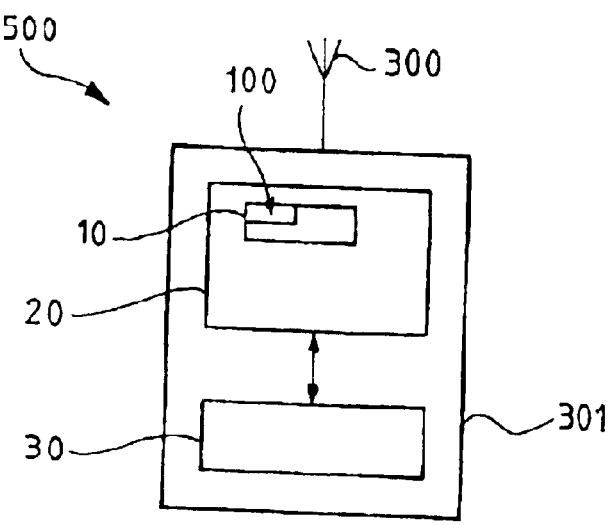
FIG_3

POWER SERVO-LOOP, AN RF SIGNAL AMPLIFIER CIRCUIT, AND AN RF SIGNAL TRANSMITTER FITTED WITH SUCH A CIRCUIT

The present invention relates to the field of transmitting radio frequency (RF) signals, and it relates more particularly to a power servo-loop, in particular for controlling a power amplifier.

BACKGROUND OF THE INVENTION

In known manner, in a telecommunications system in which an RF signal transmitter is sending to a receiver of such signals, it is necessary to ensure maximum quality of service. For example, when transmitting digital signals, this condition requires the binary error rate to remain at all times below a specified rate. To satisfy this condition on reception, it is necessary to ensure that the received signal-to-noise ratio is at all times above a predetermined value.

In order to make it possible to raise the power of the RF signals for transmission, the transmitter is provided with a power amplifier. By way of example, for a call between a mobile terminal and a base station in a cellular network of the GSM (global system for mobile communications) type, the purpose of the power amplifier is to transmit at a power that is sufficient to enable the corresponding base station to receive properly in compliance with the specifications in force. Thus, when the base station is far away from the terminal so that it receives the communications information from the terminal poorly or not at all, the base station sends an instruction to the terminal to transmit at a higher power level as determined by the base station.

In a transmitter, it is known for the amplifier to be servo-controlled by means of a power servo-loop that regulates the power of the RF signals for transmission at the output of the amplifier.

More precisely, an RF signal generated by the transmitter is supplied to the input of the amplifier. The power loop includes a detection circuit having coupling means for taking off a fraction of the output signal from the power amplifier. This RF signal as taken off represents the output signal and it is rectified on passing through a diode of a detection unit so as to constitute a "detection" direct current (DC) voltage level. This detection voltage is then compared with a reference voltage by means of a comparator unit placed at the outlet from the detection circuit. Until the reference voltage has been reached, the comparator unit acts on the power amplifier to increment the power level of the output signal.

Unfortunately, it can happen that an interference RF signal travels through the transmitter in the direction opposite to the propagation direction of the output signal. For example, this may be power reflected from a mismatched antenna of the transmitter, i.e. an antenna having a high standing wave ratio (SWR). This interference signal also has a fraction of its power taken off via the coupling means of the detection circuit, which fraction is added to the taken-off fraction of the output signal and leads to distortion such that the detection voltage is no longer a true image of the output signal. This poor detection degrades the servo-control of the amplifier. This can lead either to the transmitter consuming too much power or to deterioration in the transmission performance of the signal for transmission.

In the prior art, certain transmitters have been fitted with a circulator located upstream from the power loop relative to the propagation direction of the reflected power. The circulator is a one-way device: it allows the signal for transmission to pass through while eliminating the reflected signal that is propagating in the opposite direction.

Such a circulator is an expensive component. In addition, because of its large size, it is difficult to integrate in certain transmitters that are of small dimensions, such as portable radio telephone stations, for example.

OBJECT AND SUMMARY OF THE INVENTION

The object of the invention is to provide a servo-loop having a detection circuit that includes detection control means and that is of lower cost.

To this end, the present invention provides a power servo-loop in particular for controlling a power amplifier, the servo-loop including a detection circuit, which comprises:

coupling means for taking off RF signals; and a detection unit for delivering a detection signal partially representative of a first RF signal taken off by the coupling means;

wherein the detection circuit further comprises, between the coupling means and the detection unit, detection control means for substantially eliminating an "interfering" second RF signal also taken off by the coupling means so that the detection signal is entirely representative of the first RF signal.

The control means of the invention are integrated in the detection circuit. It is no longer necessary to use a circulator upstream from the loop as in the prior art.

In a preferred embodiment of the invention, the detection circuit comprises, at the output from the coupling means, first and second "output" branches interconnected on a "detection" branch including the detection unit, each output branch serving to convey a respective component of the interference signal as taken off. The detection control means comprise first phase shifter means inserted in the first output branch, and second phase shifter means inserted in the second output branch, the first and second phase shifter means being suitable for inducing substantially opposite phase shifts to said components.

The phase shifter means of the invention cause the components of the interfering signal that are taken off to be in phase opposition so that they cancel at the detection branch.

Preferably, each of the first and second phase shifter means comprises an inductor coupled with a capacitor.

Thus, the control means of the invention include low cost discrete components that are easy to integrate in portable equipment and that can easily be added to loops that already exist.

In this particular embodiment, the first output branch may comprise a main branch leading to the detection branch and including a first one of said inductors, together with a secondary branch including a first one of said capacitors, which is connected between a ground plane and a connection point with the associated main branch. The second output branch may also comprise a main branch leading to the detection branch and including the other one of said capacitors, which is substantially identical to the first capacitor, and a secondary branch including the other one of said inductors, which is substantially identical to the first inductor, and which is connected between a ground plane and a connection point with the associated main branch.

Advantageously, the detection control means comprise an attenuator disposed in one of the output branches so as to make it easier to equalize the amplitudes of the two interference signal components that are to be eliminated.

Preferably, the coupling means comprise phase shifter means suitable for phase shifting the taken-off RF signals.

The present invention also provides an RF signal amplification circuit comprising a power amplifier and a power servo-loop for said amplifier as defined above.

The present invention also provides an RF signal transmitter having RF signal transmitter means fitted with an amplification circuit as defined above.

The transmitter of the invention is preferably selected from the group comprising: portable radio telephone stations; personal digital assistants; and portable computers.

A portable radio telephone station of the invention may be a cellular telephone of the GSM type, of the digital communication system (DCS) type, or of the universal mobile telecommunications system (UMTS) type, or it may be a telephone of the digital European cordless telecommunications (DECT) type.

BRIEF DESCRIPTION OF THE DRAWINGS

The invention will be better understood on reading the following description and on examining the accompanying figures. The figures are given by way of indication and they do not limit the invention. In the figures:

FIG. 1 shows an embodiment of a detection circuit in a power loop of the invention;

FIG. 2 shows an embodiment of an amplification circuit of the invention; and

FIG. 3 shows an embodiment of a portable radio telephone terminal of the invention.

MORE DETAILED DESCRIPTION

FIG. 1 shows an embodiment of a detection circuit 100 for a power loop of the invention.

The detection circuit 100 comprises:

coupling means 1 of the hybrid directional coupler type having phase shifter means 11, 12, 13 for taking off RF signals weighted by respective appropriate takeoff gain factors $G_1$, $G_2$, $G_3$, and for phase shifting them by $\Delta\phi_1$, $\Delta\phi_2$, $\Delta\phi_3$, respectively;

first and second output branches B1 and B2 interconnected at an interconnection point A to a "detection" branch B3 comprising a detection unit 3 made up of a rectifier diode 31 connected to a resistor 32 and a capacitor 33 in parallel and connected to a ground plane M3; and detection control means comprising:

first phase shifter means 21 inserted in the first output branch B1 to phase shift RF signals by $-\Delta\phi_0$s, and second phase shifter means 22 inserted in the second output branch B2 to phase shift RF signals by $\Delta\phi_0$, each of the means 21 and 22 comprising a respective inductor 210, 220 coupled to a respective capacitor 211, 221; and an attenuator 4 having an appropriate attenuation gain factor $G_4$, e.g. placed in the second output branch B2 between the second means 22 and the coupling means 1.

More precisely, the first output branch B1 comprises a main branch B1a comprising a first one of the inductors 210 leading to the detection branch B3 at the interconnection point A, and a secondary branch B1b comprising a first one of the capacitors 211 extending between a ground plane M1 and a connection point P1 where it is connected to the associated main branch B1a. Similarly, the second output branch B2 comprises a main branch B2a comprising the other capacitor 221, which is substantially identical to the first capacitor 211, and which leads to the detection branch B3 at the interconnection point A, together with a secondary branch B2b comprising the other inductor 220, which is substantially identical to the first inductor 210, and which is connected between a ground plane M2 and a connection point P2 where it is connected to the associated main branch B2a.

The dynamic operation of the loop is described starting from the path of an "incident" power RF current Iin coming from a power amplifier (not shown) and propagating in the direction Z, and the path of an interfering power RF current Iref, e.g. current reflected from an antenna (not shown) and propagating in the opposite direction Z'.

At the input of the output branch B2a, the component $Iin_1$ of the taken-off incident current, and the component $Iref_1$ of the taken-off reflected current are written respectively as follows:

$Iin_1 = G_1 \times Iin\ e(j\Delta\phi_1)$ $Iref_1 = G_2 \times Iref\ e(j\Delta\phi_2)$ At the output from the first phase shifter means 21, these currents become:

$I'in_1 = G_1 \times Iin\ e(j\Delta\phi_1 - \Delta\phi_0)$ $I'ref_1 = G_2 \times Iref\ e(j\Delta\phi_2 - \Delta\phi_0)$ At the input of the output branch B2b, the component $Iin_2$ of the taken-off incident current, and the component $Iref_2$ of the taken-off reflected current are written respectively as follows:

$Iin_2 = G_2 \times Iin\ e(j\Delta\phi_2)$ $Iref_2 = G_3 \times Iref\ e(j\Delta\phi_3)$ After passing through the attenuator 4 and the second phase shifter means 21, these currents become:

$I'in_2 G_4 \times G_2 \times Iin\ e(j\Delta\phi_2 + \Delta\phi_0)$ $I'ref_1 = G_4 \times G_3 \times Iref\ e(j\Delta\phi_3 + \Delta\phi_0)$ At point A, the total current I can be written as follows:

$$I = I'ref_1 + I'ref_2 + I'in_1 + I'in_2 =$$
$$Iref[G_4 \times G_3 e(j\Delta\phi_3 + \Delta\phi_0) + G_2 e(j\Delta\phi_2 - \Delta\phi_0)] +$$
$$Iin[G_4 \times G_2 e(j\Delta\phi_2 + \Delta\phi_0) + G_1 e(j\Delta\phi_1 - \Delta\phi_0)]$$

In general, $G_4$ is selected so as to ensure that the amplitudes of the components $I'ref_1$ and $I'ref_2$ of the taken-off reflected current are equal at point A, which condition is given by the formula:

$$G_4 \times G_3 = G_2$$

Whence: $G_4 = G_2/G_3$.

$G_3$ is preferably selected to lie in the range −10 decibels (dB) to −14 dB, and $G_2$ lies in the range −20 dB to −25 dB. For example, for $G_3 = -10$ dB and $G_2 = -20$ dB, $G_4$ is −10 dB.

In parallel, $\Delta\phi_0$ is selected to satisfy the condition whereby the phases of the components $I'ref_1$ and $I'ref_2$ of the taken-off reflected current are in phase opposition at the point A, which condition is given by the following formula:

$$(\Delta\phi_3 + \Delta\phi_0) - (\Delta\phi_2 - \Delta\phi_0) = \pi$$

It is preferable to select $\Delta\phi_1 = \Delta\phi_3 = 0$ and $\Delta\phi_2 = \pi/2$ since those are the properties of ordinary couplers.

This gives: $\Delta\phi_0 = \pi/4$.

Thus, the inductances and capacitances are adjusted so as to obtain that phase shift in the RF range at which the loop operates. For example, in the frequency band commonly used in radio telephones (900 megahertz (MHz) or 1800 MHz, for example), the capacitances are about 10 picofarads (pF) and the inductances are about 5 nanohenries (nH).

With these selected values for the phase shifts imparted by the means 11, 12, 13, 21, 22, the components I'in$_1$ and I'in$_2$ of the incident current as taken off and as reaching the point A are also in phase opposition. G$_1$≠G$_2$ is thus an additional necessary condition that must be satisfied in order to avoid cancelling the incident currently that is taken off. In practice, G$_1$ is always much greater than G$_2$ since that is a property of the couplers used in radio telephones.

Finally, the total current I becomes:
I=Iin[G$_2^2$×G$_1^{-1}$ e(j3π/4)+G$_1$ e(−π/4)]

The I'in$_1$ component of amplitude G$_2^2$×G$_1^{-1}$ is negligible compared with the I'in$_2$ component of amplitude G$_1$, given that G$_1$>>G$_2$.

By way of example, G$_1$ is selected to be equal to G$_3$.

The total current I is rectified on passing the diode 31 so as to provide a DC detection voltage Vdet:
Vdet=K×I$^2$=K×Iin$^2$×[G$_2^2$×G$_3^{-1}$e(j3π/4)+G$_3$ e(−π/4)]

The means of the invention ensure that this voltage is indeed representative of the incident current as taken off: the detection circuit 100 is thus effective.

FIG. 2 shows an embodiment of an amplification circuit of the invention containing an amplifier 200 and a power servo-loop 10 of the invention including the detection circuit 100 as described with reference to FIG. 1.

The power amplifier 200, e.g. a transistor that operates in non-linear manner, receives a power RF current that is to be amplified. This current comes from upstream treatment units. In the context of GSM type telephony, speech as carried by sound waves is converted into an analog electrical current and then into a digital current. This is subjected to phase modulation and possibly also amplitude modulation by a modulator (not shown). As mentioned above, this digital current needs to be subjected to power amplification in order to enable it to be received by the base station (not shown) in communication with the telephone. At the output from such a modulator, the current is preamplified by a preamplifier (not shown).

The output current from the amplifier 200, Iin, is then directed to an antenna 300 to establish the connection with the corresponding base station. 20, A fraction of this signal is taken off by the detection circuit 100.

The power loop 10 is also connected to an input 201 of the amplifier 200, which input receives the bias voltage control of the amplifier.

At the output from the detection unit (see FIG. 1) of the circuit 100 there is a detection voltage Vdet which is delivered to the input of a conventional comparator unit 400.

This unit 400 conventionally comprises two resistors 41 and 42 each connected to a respective input terminal of an operational amplifier 44. A capacitor 43 is connected in parallel, one of its ends being connected to the first resistor 41 which is in turn connected to the output from the detector unit, and its other end being connected to the output from the operational amplifier 200. The other end of the second resistor 42 is connected to a second input terminal of the comparator unit 400. This second input terminal is connected to an output of a digital-to-analog converter 7 whose input is connected to an output of a microcontroller 5. The microcontroller is also connected to a memory 6.

The output of the comparator unit 400 is connected to the bias voltage control input 201 of the power amplifier 200.

The output power level to be used is governed by the microcontroller 5. The memory 6 has a correspondence table which puts a plurality of transmitter power values (e.g. 33 dBm, i.e. 33 decibels relative to one milliwatt) with a respective plurality of numerical values. Thus, the transmission power of 33 dBm corresponds to a predetermined numerical value. This value is converted into an analog reference signal by the converter 7 so as to apply a reference voltage Vref to one of the input terminal of the comparator 400.

So long as the voltage Vdet at the output from the detection unit is less than Vref at the first terminal of the operational amplifier 44, the comparator unit 400 delivers a positive and increasing DC voltage so as to act on the bias voltage of the amplifier 200. The voltage Vdet thus varies until it reaches the value Vref.

The comparator unit 400 is thus arranged in the power loop 10 so as to adjust the power to the desired level.

FIG. 3 shows an embodiment of a portable radio telephone terminal 500 of the invention, e.g. of the GSM type, comprising an antenna 300 and a housing 301 with transmitter means 30 for transmitting modulated RF signals connected to an amplification circuit 20 of the invention such as the circuit shown in FIG. 2, and including a power servo-loop 10 having a detection circuit 100 as described with reference to FIG. 1.

Naturally, the invention is not limited to the embodiments described above.

The values given for the phase shift parameters and for the signal taking and attenuation factors are given by way of indication, as is the location of the attenuator.

In addition, the antenna of the portable terminal of the invention could equally well be contained inside the housing of the terminal.

What is claimed is:

1. A power servo-loop (10) in particular for controlling a power amplifier (200), the servo-loop including a detection circuit (100) which comprises:

coupling means (1) for taking off RF signals; and a detection unit (400) for delivering a detection signal (Vdet) partially representative of a first RF signal taken off by the coupling means, wherein the detection circuit further comprises, between the coupling means and the detection unit, detection control means (21, 22, 4) for substantially eliminating an "interfering" second RF signal also taken off by the coupling means so that the detection signal is entirely representive of only the first RF signal, wherein said first RF signal is an incident signal, and said second RF signal is a reflected version of said first signal and propagates in a direction opposite to that of said first signal, and wherein said detection control means comprises means for phase-shifting and attenuating components of only said second RF signal so that said components are canceled out of the detection signal.

2. A power servo-loop (10) A power servo-loop (10) in particular for controlling a power amplifier (200), the servo-loop including a detection circuit (100) which comprises:

coupling means (1) for taking off RF signals; and a detection unit (400) for delivering a detection signal (Vdet) partially representative of a first RF signal taken off by the coupling means, wherein the detection circuit further comprises, between the coupling means and the detection unit, detection control means (21, 22, 4) for substantially eliminating an "interfering" second RF signal also taken off by the coupling means so that the detection signal is entirely representative of the first RF signal, wherein the detection circuit (100) comprises, at the output from the coupling means (1), first and second "output" branches (B1, B2) interconnected on a "detection" branch (B3) including the detection unit (400), each output branch serving to convey a respective component (Iref1, Iref2) of the interference signal as taken off, and wherein the detection control means comprise first phase shifter means (21) inserted in the first output branch, and second phase shifter means (22) inserted in the second output branch, the first and second phase shifter means being suitable for inducing substantially opposite phase shifts to said components.

3. A power servo-loop (10) according to claim 2, wherein each of the first and second phase shifter means (21, 22) comprises an inductor (210, 220) coupled with a capacitor (211, 221).

4. A power servo-loop (10) according to claim 3, wherein the first output branch (B1) comprises a main branch (B1a) leading to the detection branch (B3) and including a first one of said inductors (210), together with a secondary branch (B1b) including a first one of said capacitors (211), which is connected between a ground plane (M1) and a connection point (P1) with the associated main branch, and wherein the second output branch (B2) comprises a main branch (B2a) leading to the detection branch (B3) and including the other one of said capacitors (221), which is substantially identical to the first capacitor (211), and a secondary branch (B2b) including the other one of said inductors (220), which is substantially identical to the first inductor (210), and which is connected between a ground plane (M2) and a connection point (P2) with the associated main branch.

5. A power servo-loop (10) according to claim 2, wherein the detection control means comprise an attenuator (4) disposed in one of the output branches (B2a).

6. A power servo-loop (10) according to claim 3, wherein the detection control means comprise an attenuator (4) disposed in one of the output branches (B2a).

7. A power servo-loop (10) according to claim 4, wherein the detection control means comprise an attenuator (4) disposed in one of the output branches (B2a).

8. A power servo-loop (10) according to claim 2, wherein the coupling means (1) comprise phase shifter means (11, 12, 13) suitable for phase shifting the taken-off RF signals.

9. A power servo-loop (10) according to claim 3, wherein the coupling means (1) comprise phase shifter means (11, 12, 13) suitable for phase shifting the taken-off RF signals.

10. A power servo-loop (10) according to claim 4, wherein the coupling means (1) comprise phase shifter means (11, 12, 13) suitable for phase shifting the taken-off RF signals.

11. A power servo-loop (10) according to claim 5, wherein the coupling means (1) comprise phase shifter means (11, 12, 13) suitable for phase shifting the taken-off RF signals.

12. A power servo-loop (10) according to claim 6, wherein the coupling means (1) comprise phase shifter means (11, 12, 13) suitable for phase shifting the taken-off RF signals.

13. A power servo-loop (10) according to claim 7, wherein the coupling means (1) comprise phase shifter means (11, 12, 13) suitable for phase shifting the taken-off RF signals.

14. An RF signal amplification circuit (20) comprising a power amplifier (200) and the power servo-loop (10) according to claim 1 for said amplifier.

15. An RF signal transmitter (500) comprising RF signal transmitter means (30) and fitted with an RF signal amplification circuit (20) according to claim 14.

16. The transmitter (500) according to claim 15, the transmitter being selected from the group consisting of: portable radio telephone stations; personal digital assistants; and portable computers.

* * * * *